(12) United States Patent
Jung et al.

(10) Patent No.: US 11,229,124 B2
(45) Date of Patent: Jan. 18, 2022

(54) METHOD FOR FORMING REDISTRIBUTION LAYER USING PHOTO-SINTERING

(71) Applicant: Research & Business Foundation Sungkyunkwan University, Suwon-si (KR)

(72) Inventors: SeungBoo Jung, Seoul (KR); KwangHo Jung, Suwon-si (KR); WooRam Myung, Suwon-si (KR); HakSan Jeong, Seoul (KR); BumGeun Park, Suwon-si (KR); ChoongJae Lee, Suwon-si (KR); KyungDeuk Min, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 372 days.

(21) Appl. No.: 16/387,742

(22) Filed: Apr. 18, 2019

(65) Prior Publication Data

US 2019/0335590 A1 Oct. 31, 2019

(30) Foreign Application Priority Data

Apr. 25, 2018 (KR) .................. 10-2018-0047651

(51) Int. Cl.
*H05K 3/12* (2006.01)
(52) U.S. Cl.
CPC ... *H05K 3/1283* (2013.01); *H05K 2203/0736* (2013.01); *H05K 2203/0759* (2013.01); *H05K 2203/0776* (2013.01); *H05K 2203/1131* (2013.01)

(58) Field of Classification Search
CPC ......... H05K 3/1283; H05K 2203/0736; H05K 2203/1131; H05K 2203/0776; H05K 2203/0759; H05K 2203/0264; H05K 3/287; H05K 3/106; H05K 1/09; H05K 3/227; H05K 3/12–1291; H01L 2224/04105; H01L 24/20; H01L 24/19; B05D 3/065; B05D 3/067
See application file for complete search history.

(56) References Cited

FOREIGN PATENT DOCUMENTS

KR 10-2010-0025865 A 3/2010

OTHER PUBLICATIONS

Bower et al., Heterogeneous Integration of Microscale Semiconductor Devices By Micro-Transfer-Printing, IEEE 65th ECTC—San Diego, CA, USA, May 26-29, 2015 (Year: 2015).*

* cited by examiner

*Primary Examiner* — Rebecca Janssen
(74) *Attorney, Agent, or Firm* — NSIP Law

(57) ABSTRACT

The present invention relates to a method for formation of a redistribution layer using photo-sintering and to the redistribution layer formed by the method. The method for forming a redistribution layer using photo-sintering includes printing, on a substrate, a liquid electrode pattern for a redistribution layer; coating a transparent polymer on the substrate and the pattern; photo-sintering the electrode pattern using photonic energy; and evaporating an organic substance contained in the liquid electrode pattern via the photo-sintering to remove the polymer on a top face of the electrode pattern to form a redistribution layer as the sintered electrode pattern.

9 Claims, 3 Drawing Sheets

[FIG. 1]
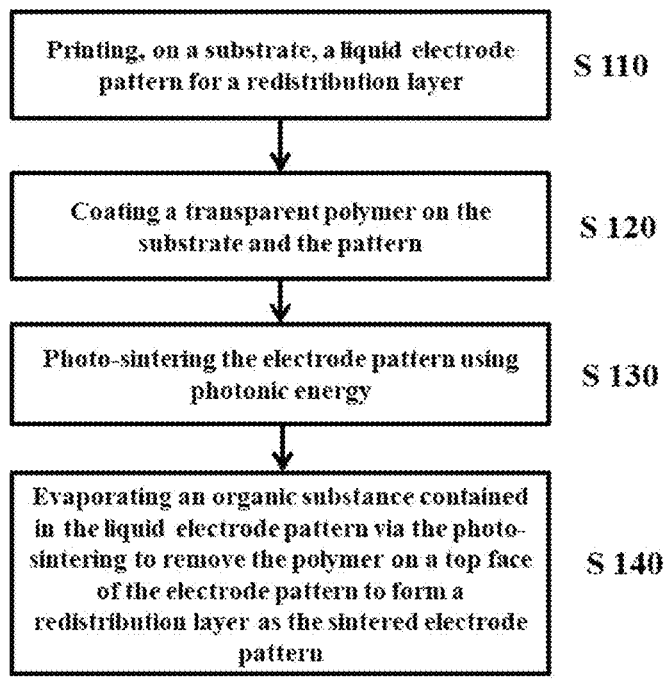
[FIG. 2]
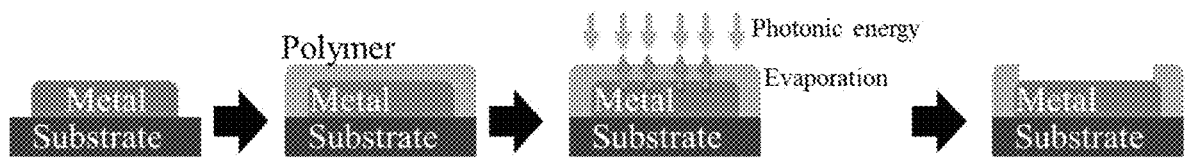

[FIG. 3a]
[FIG. 3b]
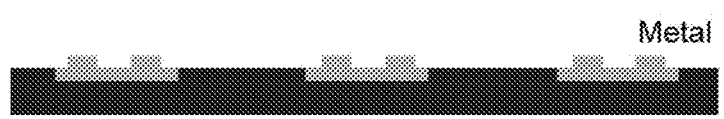
[FIG. 3c]
[FIG. 3d]
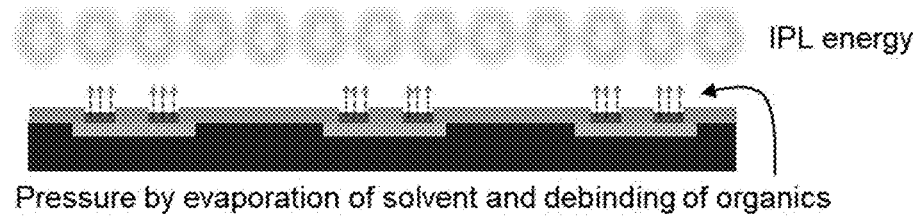
Pressure by evaporation of solvent and debinding of organics
[FIG. 3e]
[FIG. 3f]

【FIG. 4a】
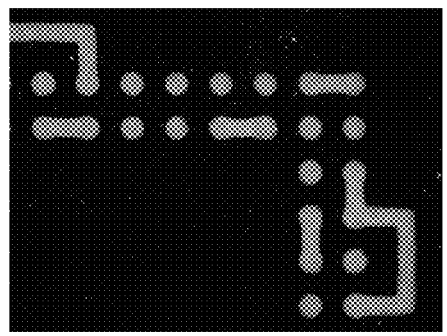
【FIG. 4b】
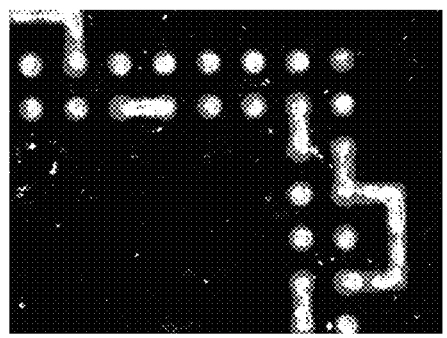
【FIG. 4c】
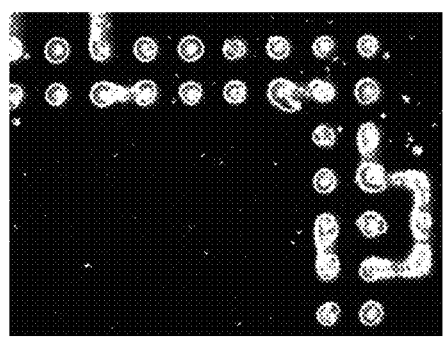
【FIG. 4d】
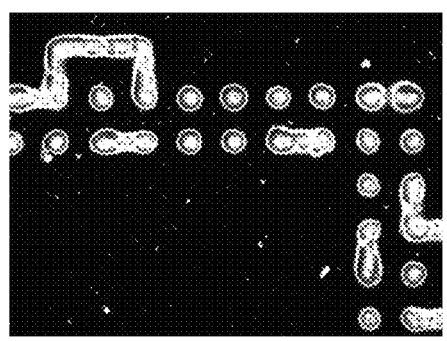

METHOD FOR FORMING REDISTRIBUTION LAYER USING PHOTO-SINTERING

CROSS-REFERENCE TO RELATED APPLICATION

This application claims a benefit under 35 U.S.C. § 119(a) of Korean Patent Application No. 10-2018-0047651 filed on Apr. 25, 2018, in the Korean Intellectual Property Office, the entire disclosure of which is incorporated herein by reference for all purposes.

BACKGROUND

1. Field

The present disclosure relates to a method for formation of a redistribution layer using photo-sintering and to the redistribution layer formed by the method.

2. Description of Related Art

The most common conductive pattern formation technique is plating. A seed layer is required to enable a metal layer growth using the plating. A separate process for forming the seed layer (such as a thin film deposition based on expensive vacuum equipment) is required.

Plating layer patterning requires strong acid solution-based plating and etching processes (including a dry process using hazardous gases). The solution used in the plating and etching processes is highly toxic, which causes problems such as environmental destruction and human hazard. Further, since the plating solution contains various compounds in a predetermined content ratio, the compound content ratio may be changed by a repetitive process. Thus, a cost for an inspection process for adjusting the compound content ratio and a cost for replacement of the plating solution may be required.

In order to obtain a high-quality metal pattern layer, a process time of at least several tens minutes to several hours is required. In this connection, a voltage may be enhanced to shorten the process time, but a high-quality plating layer cannot be obtained. In addition, a long process time is problematic due to various process steps such as seed layer formation, photolithography, plating, and etching.

The plating technique requires the formation of the seed layer and uses the strong acid solution. Thus, the plating technique may not be applied to a polymer substrate which is weak in interfacial adhesion and vulnerable to an acid. Thus, the plating technique may not be applied to a flexible electronic device which has been receiving attention recently and uses the polymer substrate.

Other techniques that may solve the above problems to some extent include printing metal inks/pastes.

The printing technique has advantages such as low cost, simple process step and short process time. However, in the printing approach, a sintering process via heat treatment at high temperature is required in order to obtain a functional/conductive printed material.

When sintering the printed material by a high-temperature heat treatment, thermal damage easily occurs to the polymer substrate. Thus, the printing technique may not be applied to a flexible electronic device which has been receiving attention recently and uses the polymer substrate.

Use of ink/paste materials made of high-priced metal nanoparticles can lower the sintering temperature and reduce the sintering time. However, the ink/paste materials made of high-priced metal nanoparticles may not be applied to all kinds of polymer substrates. Thus, a new low-temperature sintering technique is constantly being studied and developed.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

A purpose of the present disclosure is to provide a novel patterning process using photo-sintering technology for process time reduction. In particular, the present disclosure suggests a process in which sintering of an electrode material and patterning of a dielectric material occur simultaneously while omitting a photolithography process.

Another purpose of the present disclosure is to provide a novel metal patterning process to overcome limitations of an existing RDL formation process.

In one aspect of the present disclosure, there is provided a method for forming a redistribution layer using photo-sintering, the method comprising: 1) printing, on a substrate, a liquid electrode pattern for a redistribution layer; 2) coating a transparent polymer on the substrate and the pattern; 3) photo-sintering the electrode pattern using photonic energy; and 4) evaporating an organic substance contained in the liquid electrode pattern via the photo-sintering to remove the polymer on a top face of the electrode pattern to form a redistribution layer as the sintered electrode pattern.

In one implementation, the liquid electrode pattern contains metal or non-metal particles.

In one implementation, the liquid electrode pattern further contains a binder, a dispersant and a solvent.

In one implementation, the method further comprises, after the printing of the liquid electrode pattern, drying the liquid electrode pattern.

In one implementation, the photo-sintering includes evaporating the organic substance to create a pressure in the pattern to swell the electrode pattern and creating pores in the pattern.

In one implementation, the method further comprises forming a stack of a plurality of redistribution layers by repeatedly performing the steps 1) to 4).

In one implementation, the polymer includes a thermosetting resin or a thermoplastic resin.

In one implementation, the polymer includes polydimethylsiloxane (PDMS) resin to define a dielectric layer, wherein the photo-sintering includes patterning the dielectric layer.

In one implementation, the PDMS resin is spin-coated on the substrate and the pattern at a speed of 6000 rpm or lower.

In another aspect of the present disclosure, there is provided a redistribution layer formed by the method defined above.

According to the present disclosure, exposure of the liquid electrode pattern to a IPL (intense pulsed light) is optional. The metal patterning is achieved within a few seconds by using the photothermal effect. In addition, since no acid solution or the like is used, there are no problems such as environmental hazard and toxicity. Further, the RDL formation process is simple and does not require expensive vacuum equipment.

Particularly, in accordance with the present disclosure, the process time was drastically shortened. A conventional thermal sintering process consumes at least 30 minutes. A conventional plating or vacuum process consumes several hours. In accordance with the present disclosure, the RLD formation process is completed within a few tens of seconds (10 seconds under 10 pulses) using the photo-sintering.

In accordance with the present disclosure, a highly integrated electronic package may be realized because a multi-layer pattern can be easily implemented via a process using a photo-thermal effect. In particular, the present disclosure suggests a process in which the sintering of the electrode material and the patterning of the dielectric may be performed simultaneously while omitting the photolithography process. This allows the photo-sintering of the electrode to pattern the liquid dielectric material.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

FIG. 1 shows a flow chart of a method of forming a redistribution layer using photo-sintering according to one embodiment of the present disclosure.

FIG. 2 shows a schematic diagram of a method of forming a redistribution layer using photo-sintering according to one embodiment of the present disclosure.

FIG. 3A to FIG. 3F show a detailed flow diagram of a method of forming a redistribution layer using photo-sintering according to an embodiment of the present disclosure.

FIG. 4A to FIG. 4D show optical microscopic results of a redistribution layer formed according to one embodiment of the present disclosure.

DETAILED DESCRIPTIONS

For simplicity and clarity of illustration, elements in the figures are not necessarily drawn to scale. The same reference numbers in different figures denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present disclosure is directed to a method for formation of a redistribution layer using photo-sintering and to the redistribution layer formed by the method.

FIG. 1 shows a flow chart of a method of forming a redistribution layer using photo-sintering according to one embodiment of the present disclosure. FIG. 2 shows a schematic diagram of a method of forming a redistribution layer using photo-sintering according to one embodiment of the present disclosure.

A method of forming a redistribution layer using photo-sintering according to one embodiment of the present disclosure includes 1) printing a liquid electrode pattern for a redistribution layer on a substrate (S 110); 2) coating a transparent polymer on the substrate and pattern (S 120); 3) photo-sintering the electrode pattern using photonic energy (S 130); and 4) evaporating an organic substance contained in the liquid electrode pattern via the photo-sintering to remove the polymer on a top face of the electrode pattern to form a redistribution layer as the sintered electrode pattern (S 140).

At S 110, the method prints the liquid electrode pattern for the redistribution layer (RDL) on the substrate. Such liquid electrode pattern may contain metal particles or non-metal particles, and additionally contains binders, dispersants, and solvents. Specific details thereof will be further described in following embodiments.

In one example, since the electrode pattern is printed in a liquid phase, the method may further include drying the liquid electrode pattern after the printing.

At S 120, the method coats the transparent polymer on the substrate having the liquid electrode pattern formed thereon at S 110. The transparent polymer may allow the liquid electrode pattern to be sintered in a subsequent photo-sintering in an accurate manner. The transparent polymer is coated on the substrate and pattern.

The polymer may include a thermosetting resin or a thermoplastic resin. The resin may be deposited by spin coating. A thickness of the polymer layer may be adjusted according to a rotational speed of the spin coating. The polymer may include PDMS (polydimethylsiloxane) to define a dielectric layer. Thus, the dielectric layer may be patterned by a subsequent photo-sintering.

In one example, in accordance with the present disclosure, the exposure may not be employed. Thus, the polymer may include a photosensitive material as well as a non-photosensitive material. The photosensitive or non-photosensitive material may include transparent or semi-transparent polymers. For example, the transparent or semi-transparent polymers may include PI, PBO, BCB, PU, etc.

At S 130, the method photo-sinters the electrode pattern using photonic energy.

In the process of the photo-sintering, the printed metal pattern is subjected to momentary light absorption, heat-emission, sintering, and organic substance and organic solvent evaporation or removal. In this process, the particles contained in the metal pattern absorb photonic energy, convert the energy into heat, and thus are instantaneously sintered. Thus, the sintered metal pattern has an electric conductivity and functions as an electric circuit.

The photo-sintering may include IPL (intense pulsed light) sintering, which generally uses an Xe lamp as a light source. The IPL sintering is not limited to a specific wavelength. Thus, the IPL sintering may form a fine pattern over a large area. Therefore, the IPL sintering may be applied to a wafer level or panel level process to increase the production amount and reduce the cost.

Particularly, in accordance with the present disclosure, the process time was drastically shortened. The conventional thermal sintering consumes at least 30 minutes. The conventional plating or vacuum process consumes several hours. However, in accordance with the present disclosure, the process is completed within a few tens of seconds (10 seconds under 10 pulses) via the photo-sintering.

At S 140, the method evaporates an organic substance contained in the liquid electrode pattern via the photo-sintering to remove the polymer on a top face of the electrode pattern to form a redistribution layer as the sintered electrode pattern.

Solvent residues and organic substances added to the liquid electrode pattern are evaporated by the photo-sintering and thus are decoupled from the particles momentarily. A thus-produced pressure may allow the polymer layer (dielectric layer) coated on the top face of the metal pattern to be removed. In this way, the dielectric patterning may be simultaneously performed together with the electrode patterning.

Further, during the rapid sintering process, the metal electrode layer is instantaneously swollen by the thus-produced pressure (the pressure produced by the organic substance evaporation and decoupling from the particles) such that pores are formed in the electrode layer. This may increase the thickness of the metal layer and also helps in patterning the dielectric layer.

According to the present disclosure, complicated dielectric layer patterning including photolithography may be omitted by patterning the dielectric layer using the above-described method.

In one example, in accordance with the present disclosure, a plurality of redistribution layers may be formed by repeatedly performing the S 110 to S 140.

The present method may be applied to various polymer substrates as well as rigid substrates. Thus, the present method may be applied to the flexible/expandable/shrinkable electric package which may be used in future wearable devices, IoT, and Body Sensor Network (BSN).

Hereinafter, the present disclosure will be further described along with specific examples but may not be limited thereto.

[Present Example 1]

Present Example 1 will be described with reference to FIG. 3A to FIG. 3F.

FIG. 3A to FIG. 3F show a detailed flow diagram of a method of forming a redistribution layer using photo-sintering according to the Present Example 1 of the present disclosure.

As in FIG. 3A, a silicon wafer was prepared in accordance with Present Example 1. A liquid electrode pattern was then printed on the water by printing a silver nanoparticle paste thereon via screen printing as in FIG. 3B. The paste contains 70 wt. % silver particles with 20 nm diameter, 23 wt. % binder and 7 wt. % dispersant. The binder contains about 9.1 wt. % of ethyl cellulose (22 cP) dissolved in α-terpineol solvent. The dispersant contains about 9.1 wt. % of polyvinylpyrrolidone (PVP, MW: 360,000) dissolved in diethyleneglycol solvent.

Then, PDMS (Sylgard 184, Dow Corning) was spin-coated on the water and pattern at 3000, 4000, 5000, 6000 and 7000 rpm as shown in FIG. 3C (Ramping: 0.3 sec, Coating time: 30 sec, Stabilization: 3000 rpm, 20 sec).

Next, photo-sintering was performed as shown in FIG. 3D. In this connection, IPL equipment commercially available from PSTEK company was used. The IPL-based photo-sintering was performed at various pulse widths (1 to 4 ms) and pulse frequencies (pulse number: 10 times, frequency: 1, 1.5 Hz) at 3, 4, 5 and 6 kJ.

In this process, the metal (silver nanoparticles in this experiment) absorbs photonic energy and converts the energy into heat, and thus is instantaneously sintered. Thus, the sintered metal has an electric conductivity and functions as an electric circuit. At this time, the added solvent residue (α-terpineol and diethyleneglycol) and the organic substance (PVP, ethyl cellulose) are evaporated instantaneously and are decoupled from the particles. A thus-produced pressure may allow the polymer layer (PDMS layer) coated on the top face of the metal pattern to be removed. In this way, the dielectric patterning may be simultaneously performed together with the electrode patterning. Further, during the rapid sintering process, the metal electrode layer is instantaneously swollen by the thus-produced pressure (the pressure produced by the organic substance evaporation and decoupling from the particles) such that pores are formed in the electrode layer. This may increase the thickness of the metal layer and also helps in patterning the dielectric layer.

Finally, the redistribution layer shown in FIG. 3E is completed. In addition, a stack of the redistribution layers may be formed by repeating the above process as shown in FIG. 3F.

The completed stack of the redistribution layers was observed using an Olympus SZ61 optical microscope. The results are shown in FIG. 4A to FIG. 4D. FIG. 4A to FIG. 4D show optical microscopic results of a redistribution layer formed according to one embodiment of the present disclosure.

FIG. 4A shows a photograph before coating the dielectric layer. FIG. 4B shows the PMDS coating formed by the spin coating at 3000 rpm and then subjected to the photo-sintering at an energy of 3 kJ (1 ms, 1 Hz). As a result, it could be confirmed that the PDMS covers a portion of the pattern. FIG. 4C shows the PMDS coating formed by the spin coating at 5000 rpm and then subjected to the photo-sintering at an energy of 4 kJ (4 ms, 1.5 Hz). As a result, it could be confirmed that the dielectric layer was patterned more clearly. FIG. 4D shows the PMDS coating formed by the spin coating at 6000 rpm and then subjected to the photo-sintering at an energy of 5 kJ (4 ms, 1.5 Hz). It is confirmed that a clearer dielectric layer pattern was formed by further increasing the energy. In one example, when the spin coating was performed at 7000 rpm, the PDMS coating did not remain because the coating speed was too fast. Therefore, the spin coating speed is preferably 6000 rpm or lower.

The description of the present embodiments has been provided so that those of ordinary skill in the art of the present disclosure may use or conduct the present disclosure. Various modifications to these embodiments will be readily apparent to those skilled in the art of the present disclosure. The generic principles defined herein may be applied to other embodiments without departing from the scope of the present disclosure. Thus, the present disclosure is not to be construed as limited to the embodiments set forth herein but rather to be accorded the widest scope consistent with the principles and novel features set forth herein.

What is claimed is:

1. A method for forming a redistribution layer using photo-sintering, the method comprising:
   1) printing, on a substrate, a liquid electrode pattern for a redistribution layer;
   2) coating a transparent polymer on the substrate and the pattern;
   3) photo-sintering the electrode pattern using photonic energy; and
   4) evaporating an organic substance contained in the liquid electrode pattern via the photo-sintering to remove the polymer on a top face of the electrode pattern to form a redistribution layer as the sintered electrode pattern.

2. The method of claim 1, wherein the liquid electrode pattern contains metal or non-metal particles.

3. The method of claim 2, wherein the liquid electrode pattern further contains a binder, a dispersant and a solvent.

4. The method of claim 1, wherein the method further comprises, after the printing of the liquid electrode pattern, drying the liquid electrode pattern.

5. The method of claim 1, wherein the photo-sintering includes evaporating the organic substance to create a pressure in the pattern to swell the electrode pattern and creating pores in the pattern.

6. The method of claim 1, wherein the method further comprises forming a stack of a plurality of redistribution layers by repeatedly performing the steps 1) to 4).

7. The method of claim 1, wherein the polymer includes a thermosetting resin or a thermoplastic resin.

8. The method of claim 7, wherein the polymer includes polydimethylsiloxane (PDMS) resin to define a dielectric layer, wherein the photo-sintering includes patterning the dielectric layer.

9. The method of claim 8, wherein the PDMS resin is spin-coated on the substrate and the pattern at a speed of 6000 rpm or lower.

* * * * *